(12) United States Patent
Ju

(10) Patent No.: US 6,725,186 B1
(45) Date of Patent: Apr. 20, 2004

(54) METHOD OF LOGIC SIMULATION

(75) Inventor: Shang-Tzu Ju, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 700 days.

(21) Appl. No.: 09/702,528

(22) Filed: Oct. 31, 2000

(30) Foreign Application Priority Data

Nov. 1, 1999 (TW) ........................................ 88118990 A

(51) Int. Cl.[7] .............................................. G06F 17/50
(52) U.S. Cl. ......................................... 703/15; 326/104
(58) Field of Search ....................... 703/15, 14; 326/54, 326/104

(56) References Cited

U.S. PATENT DOCUMENTS

| | | | |
|---|---|---|---|
| 4,787,062 A | * | 11/1988 | Nei et al. ..................... 703/15 |
| 4,945,503 A | * | 7/1990 | Takasaki ...................... 703/15 |
| 6,182,020 B1 | * | 1/2001 | Fairbanks .................... 702/117 |
| 6,338,025 B1 | * | 1/2002 | Bowen et al. ................. 702/60 |
| 6,604,065 B1 | * | 8/2003 | Blomgren et al. ............ 703/15 |

* cited by examiner

Primary Examiner—Albert W. Paladini
(74) Attorney, Agent, or Firm—Alston & Bird LLP

(57) ABSTRACT

The present invention is related to a method of logic simulation performed by a simulator for solving the problem of the false unknown state. The method includes steps of defining a high potential state, a low potential state, an unknown state and an inverse unknown state for a plurality of nodes of a logic circuit, obtaining a plurality of truth tables according to the high potential state, the low potential state, the unknown state and the inverse unknown state, and achieving the logic simulation according to the plural truth tables.

34 Claims, 2 Drawing Sheets

METHOD OF LOGIC SIMULATION

FIELD OF THE INVENTION

The present invention is related to a method of logic simulation, and particularly to a method of logic simulation performed by a simulator.

BACKGROUND OF THE INVENTION

As time goes by, the electronic devices are further minimized in size. The circuits of the electronic devices thus become more and more complicated. However, the more complicated the circuit is, the higher the possibility to arise problems in logic simulation is.

Generally, logic simulation performed by a simulator is achieved by referring to the truth tables of the logic gates. From each node state of the plural nodes of a logic circuit, the final output node state of the logic circuit can be obtained by looking up the truth tables. According to the prior art, a high potential state, a low potential state and an unknown state are defined for the plural nodes of the logic circuit. In most situations, the method of logic simulation works smoothly for the logic circuit. However, a node state can't be identified in some specific situations.

Please refer to FIG. 1 which is a schematic diagram showing a first example of a logic circuit. In real operation of the logic circuit, as long as the node state of the input node 11 and that of the input node 13 are the high potential states, the node state of the output node 17 must be the high potential state regardless of the node state of the input node 12. However, in logic simulation performed by a simulator according to the prior art, the node state of the output node 17 can't be identified in some specific situations. By referring to Table 1 which is a truth table of a NAND gate according to the prior art, three different situations are described more specifically as follows.

TABLE 1

| The first input node | The second input node | The output node |
|---|---|---|
| 0 | 0 | 1 |
| 0 | 1 | 1 |
| 0 | U | 1 |
| 1 | 0 | 1 |
| 1 | 1 | 0 |
| 1 | U | U |
| U | 0 | 1 |
| U | 1 | U |
| U | U | U | a) Given that the node state of the input node 11 and that of the input node 13 are the high potential states, and the node state of the input node 12 is the low potential state, then the node state of the node 14 is the high potential state, the node state of the node 15 is the high potential state and that of the node 16 is the low potential state. Therefore, the node state of the output node 17 is the high potential state.

b) Given that the node state of the input node 11 and that of the input node 13 are the high potential states, and the node state of the input node 12 is the high potential state, then the node state of the node 14 is the low potential state, the node state of the node 15 is the low potential state and that of the node 16 is the high potential state. Therefore, the node state of the output node 17 is the high potential state.

c) Given that the node state of the input node 11 and that of the input node 13 are the high potential states, and the node state of the input node 12 is the unknown state, then the node state of the node 14 is the unknown state, the node state of the node 15 is the unknown state and that of the node 16 is the unknown state. Therefore, the node state of the output node 17 is the unknown state. Therefore, in logic simulation, the node state of the output node 17, i.e. the unknown state, can't be identified in some situations. This kind of node state which can be determined in real operation of the logic circuit and can't be identified in some situations is called "false unknown state".

Please refer to FIG. 2 which is a schematic diagram showing a second example of a logic circuit. In real operation of the logic circuit, as long as the node state of the input node 11 and that of the input node 13 are the low potential states, the node state of the output node 17 must be the low potential state regardless of the node state of the input node 12. However, in logic simulation performed by a simulator according to the prior art, the node state of the output node 17 can't be identified in some specific situations either.

In reality, the circuits for manufacturing electronic devices are much more complicated than the circuits depicted in FIG. 1 and FIG. 2. The possibility to arise the problem of false unknown state in logic simulation is much higher.

SUMMARY OF THE INVENTION

An object of the present invention is to provide a method of logic simulation for solving the problem of false unknown state.

According to a first aspect of the present invention, a method of logic simulation comprises the steps of defining a high potential state, a low potential state, an unknown state and a fourth state for a plurality of nodes of a logic circuit, obtaining a simulating reference according to the high potential state, the low potential state, the unknown state and the fourth state, and achieving the logic simulation according to the simulating reference.

Preferably, the logic simulation is performed by a simulator.

Preferably, the fourth state is an inverse unknown state.

Preferably, the simulating reference includes a plurality of truth tables.

Preferably, the high potential state is symbolized by "1", the low potential state is symbolized by "0", the unknown state is symbolized by "Un" and the inverse unknown state is symbolized by "~Un", wherein "n" represents the node number of the node.

According to a second aspect of the present invention, a simulating reference of a NAND gate, adapted to be used in logic simulation, is obtained by defining a high potential state, a low potential state, an unknown state and a fourth state for a first input node, a second input node and an output node of the NAND gate.

Preferably, the simulating reference is a truth table.

Preferably, the node number of the output node is 3, the node number of the first input node is 1 and the node number of the second input node is 2.

Preferably, the fourth state is an inverse unknown state.

Preferably, the high potential state is symbolized by "1", the low potential state is symbolized by "0", the unknown state is symbolized by "Un" and the inverse unknown state is symbolized by "~Un", wherein "n" represents a node number of the node.

Preferably, the node state of the output node is "~Uy" when the node state of the first input node is "1" and that of the second input node is "Uy".

Preferably, the node state of the output node is "1" when the node state of the first input node is "0" and that of the second input node is "Uy". Preferably, the node state of the output node is "Uz" when the node state of the first input node is "Ux" and that of the second input node is "Uy" if x is unequal to y.

Preferably, the node state of the output node is "~Ux" when the node state of the first input node is "Ux" and that of the second input node is "Uy" if x is equal to y.

Preferably, the node state of the output node is "Uz" when the node state of the first input node is "Ux" and that of the second input node is "~Uy" if x is unequal to y.

Preferably, the node state of the output node is "1" when the node state of the first input node is "Ux" and that of the second input node is "~Uy" if x is equal to y.

According to a third aspect of the present invention, a simulating reference of a NOR gate, adapted to be used in logic simulation, is obtained by defining a high potential state, a low potential state, an unknown state and a fourth state for a first input node, a second input node and an output node of the NOR gate.

Preferably, the simulating reference is a truth table.

Preferably, the node number of the output node is 3, the node number of the first input node is 1 and the node number of the second input node is 2.

Preferably, the fourth state is an inverse unknown state.

Preferably, the high potential state is symbolized by "1", the low potential state is symbolized by "0", the unknown state is symbolized by "Un" and the inverse unknown state is symbolized by "~Un", wherein "n" represents a node number of the node.

Preferably, the node state of the output node is "0" when the node state of the first input node is "1" and that of the second input node is "Uy".

Preferably, the node state of the output node is "~Uy" when the node state of the first input node is "0" and that of the second input node is "Uy".

Preferably, the node state of the output node is "Uz" when the node state of the first input node is "Ux" and that of the second input node is "Uy" if x is unequal to y.

Preferably, the node state of the output node is "~Ux" when the node state of the first input node is "Ux" and that of the second input node is "Uy" if x is equal to y.

Preferably, the node state of the output node is "Uz" when the node state of the first input node is "Ux" and that of the second input node is "~Uy" if x is unequal to y.

Preferably, the node state of the output node is "0" when the node state of the first input node is "Ux" and that of the second input node is "~Uy" if x is equal to y.

According to a fourth aspect of the present invention, a simulating reference of a NOT (INV) gate, adapted to be used in logic simulation, is obtained by defining a high potential state, a low potential state, an unknown state and a fourth state for an input node and an output node of the NOT (INV) gate.

Preferably, the simulating reference is a truth table.

Preferably, the node number of the input node is 1 and the node number of the output node is 2.

Preferably, the fourth state is an inverse unknown state.

Preferably, the high potential state is symbolized by "1", the low potential state is symbolized by "0", the unknown state is symbolized by "Un" and the inverse unknown state is symbolized by "~U", wherein "n" represents a node number of the node.

Preferably, the node state of the output node is "~Ux" when the node state of the input node is "Ux".

Preferably, the node state of the output node is "Ux" when the node state of the input node is "~Ux".

BRIEF DESCRIPTION OF THE DRAWING

The present invention may best be understood through the following description with reference to the accompanying drawings, in which.

DETAILED DESCRIPTION OF THE PREFERRED EMBODIMENTS

The present invention is related to a method of logic simulation performed by a simulator for solving the problem of the false unknown state. The method of logic simulation comprises the steps of a) defining a high potential state, a low potential state, an unknown state and an inverse unknown state for a plurality of nodes of a logic circuit, b) obtaining a plurality of truth tables according to the high potential state, the low potential state, the unknown state and the inverse unknown state, and c) achieving the logic simulation according to the plural truth tables. The high potential state is symbolized by "1", the low potential state is symbolized by "0", the unknown state is symbolized by "Un" and the inverse unknown state is symbolized by "~Un", wherein "n" represents the node number of the node. The truth tables of the logic gates are obtained according to the defined high potential state, the low potential state, the unknown state and the inverse unknown state. Table 2, Table 3 and Table 4 are respectively the truth tables of a NAND gate, a NOR gate and a NOT (INV) gate according to the present invention.

Figure 1:
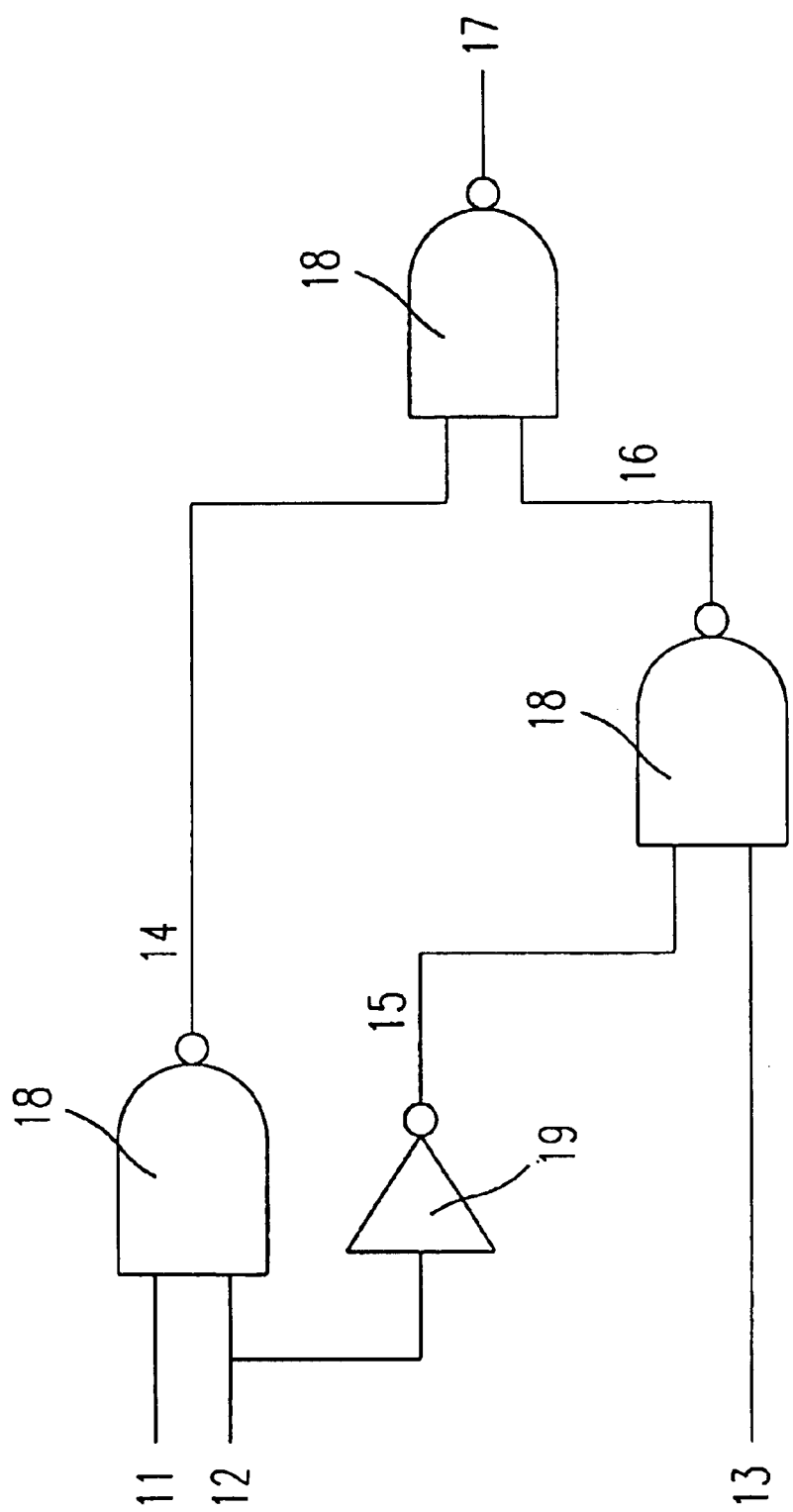
FIG. 1 is a schematic diagram showing a first example of a logic circuit.

Please further refer to FIG. 1, and Table 2 and Table 4. Given that the node state of the input node 11 and that of the input node 13 are the high potential states which are symbolized by "1", and the node state of the input node 12 is the unknown state which is symbolized by "U2", then the node state of the node 14 is "~U2", the node state of the node 15 is "~U2" and that of the node 16 is "U2". Therefore, the node state of the output node 17 is "1", i.e. the high potential state.

Figure 2:
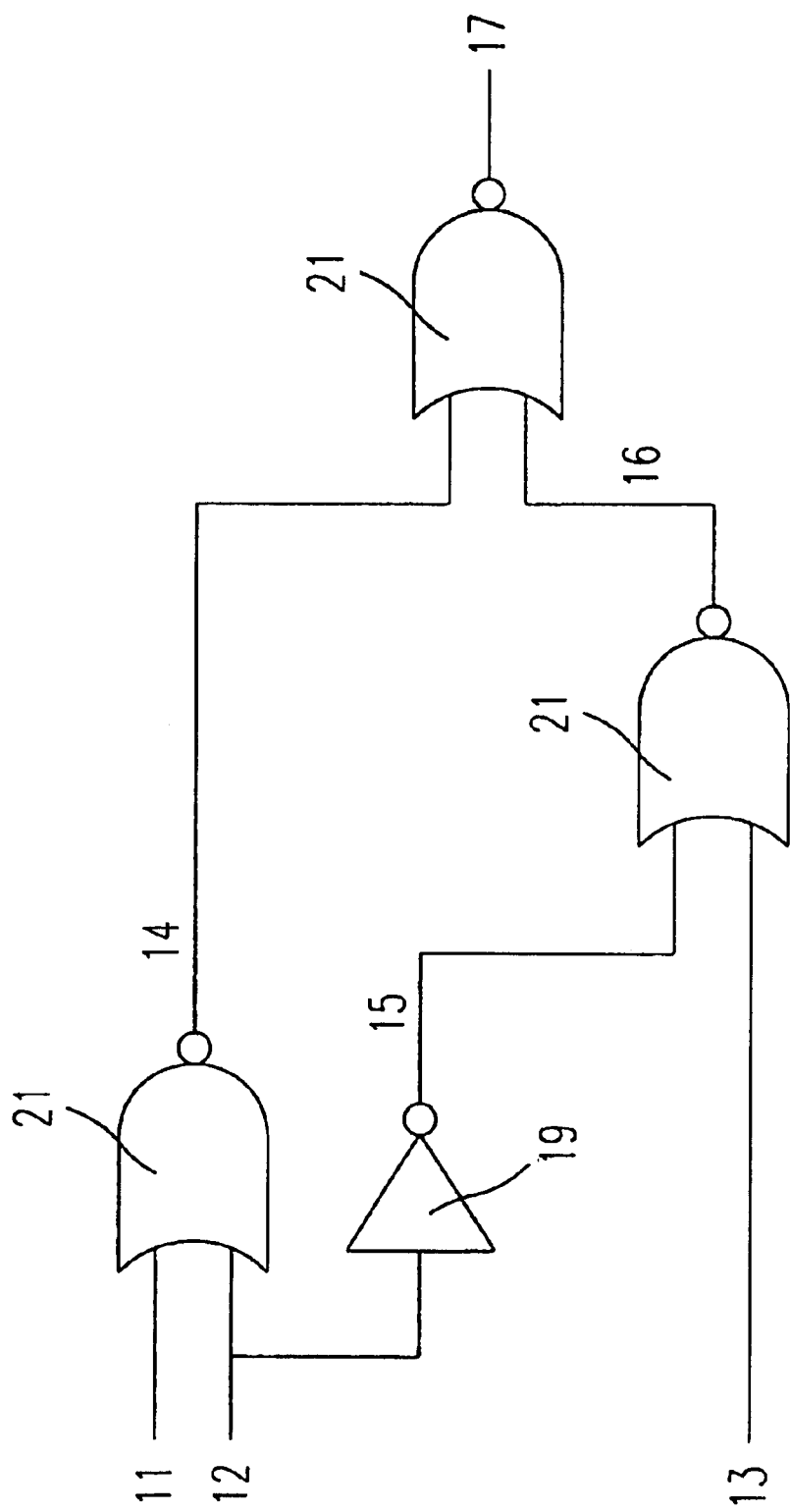
FIG. 2 is a schematic diagram showing a second example of a logic circuit.

Please further refer to FIG. 2, and Table 3 and Table 4. Given that the node state of the input node 11 and that of the input node 13 are the low potential states which are symbolized by "0", and the node state of the input node 12 is the unknown state which is symbolized by "U2", then the node state of the node 14 is "~U2", the node state of the node 15 is "~U2" and that of the node 16 is "U2". Therefore, the node state of the output node 17 is "0", i.e. the low potential state.

TABLE 2

The truth table of a NAND gate according to the present invention.

| The first input node | The second input node | The output node |
|---|---|---|
| 0 | 0 | 1 |
| 1 | 0 | 1 |
| 1 | 1 | 0 |
| 1 | Uy | ~Uy |
| 0 | Uy | 1 |

TABLE 2-continued

The truth table of a NAND gate according to the present invention.

| The first input node | The second input node | The output node |
|---|---|---|
| Ux | Uy | Uz, when x is unequal to y |
|  |  | ~Uz, when x is equal to y |
| 1 | ~Uy | Uy |
| 0 | ~Uy | 1 |
| Ux | ~Uy | Uz, when x is unequal to y |
|  |  | 1, when x is equal to y |

TABLE 3

The truth table of a NOR gate according to the present invention.

| The first input node | The second input node | The output node |
|---|---|---|
| 0 | 0 | 1 |
| 1 | 0 | 0 |
| 1 | 1 | 0 |
| 1 | Uy | 0 |
| 0 | Uy | ~Uy |
| Ux | Uy | Uz, when x is unequal to y |
|  |  | ~U1, when x is equal to y |
| 1 | ~Uy | 0 |
| 0 | ~Uy | Uy |
| Ux | ~Uy | Uz, when x is unequal to y |
|  |  | 0, when x is equal to y |

TABLE 4

The truth table of a NOT (INV) gate according to the present invention.

| The input node | The output node |
|---|---|
| 0 | 1 |
| 1 | 0 |
| Ux | ~Ux |
| ~Ux | Ux |

Accordingly, according to the present invention, the problem of the false unknown state is obviated. Certainly, the logic gates are not limited to the NAND gate, the NOR gate and the NOT (INV) gate. The truth tables of other types of logic gates can also be obtained by defining a high potential state, a low potential state, an unknown state and an inverse unknown state for a plurality of nodes of the logic circuit.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

I claim:

1. A method of logic simulation, comprising steps of:
   (1) defining a high potential state, a low potential state, an unknown state and a fourth state for a plurality of nodes of a logic circuit;
   (2) obtaining a simulating reference according to said high potential state, said low potential state, said unknown state and said fourth state; and
   (3) achieving said logic simulation according to said simulating reference.

2. The method according to claim 1, wherein said logic simulation is performed by a simulator.

3. The method according to claim 1, wherein said fourth state is an inverse unknown state.

4. The method according to claim 3, wherein said simulating reference includes a plurality of truth tables.

5. The method according to claim 4, wherein said high potential state is symbolized by "1", said low potential state is symbolized by "0", said unknown state is symbolized by "Un" and said inverse unknown state is symbolized by "~Un", wherein "n" represents the node number of said node.

6. A simulating reference of a NAND gate, adapted to be used in logic simulation, obtained by defining a high potential state, a low potential state, an unknown state and a fourth state for a first input node, a second input node and an output node of said NAND gate.

7. The reference according to claim 6, wherein said simulating reference is a truth table.

8. The reference according to claim 7, wherein node number of said output node is 3, node number of said first input node is 1 and node number of said second input node is 2.

9. The reference according to claim 7, wherein said fourth state is an inverse unknown state.

10. The reference according to claim 9, wherein said high potential state is symbolized by "1", said low potential state is symbolized by "0", said unknown state is symbolized by "Un" and said inverse unknown state is symbolized by "~Un", wherein "n" represents a node number of said node.

11. The reference according to claim 10, wherein node state of said output node is "~Uy" when node state of said first input node is "1" and that of said second input node is "Uy".

12. The reference according to claim 10, wherein node state of said output node is "1" when node state of said first input node is "0" and that of said second input node is "Uy".

13. The reference according to claim 10, wherein node state of said output node is "Uz" when node state of said first input node is "Ux" and that of said second input node is "Uy" if x is unequal to y.

14. The reference according to claim 10, wherein node state of said output node is "~Ux" when node state of said first input node is "Ux" and that of said second input node is "Uy" if x is equal to y.

15. The reference according to claim 10, wherein node state of said output node is "Uz" when node state of said first input node is "Ux" and that of said second input node is "~Uy" if x is unequal to y.

16. The reference according to claim 10, wherein node state of said output node is "1" when node state of said first input node is "Ux" and that of said second input node is "~Uy" if x is equal to y.

17. A simulating reference of a NOR gate, adapted to be used in logic simulation, obtained by defining a high potential state, a low potential state, an unknown state and a fourth state for a first input node, a second input node and an output node of said NOR gate.

18. The reference according to claim 17, wherein said simulating reference is a truth table.

19. The reference according to claim 18, wherein node number of said output node is 3, node number of said first input node is 1 and node number of said second input node is 2.

20. The reference according to claim 18, wherein said fourth state is an inverse unknown state.

21. The reference according to claim 20, wherein said high potential state is symbolized by "1", said low potential state is symbolized by "0", said unknown state is symbolized by "Un" and said inverse unknown state is symbolized by "~Un", wherein "n" represents a node number of said node.

22. The reference according to claim 21, wherein node state of said output node is "0" when node state of said first input node is "1" and that of said second input node is "Uy".

23. The reference according to claim 21, wherein node state of said output node is "~Uy" when node state of said first input node is "0" and that of said second input node is "Uy".

24. The reference according to claim 21, wherein node state of said output node is "Uz" when node state of said first input node is "Ux" and that of said second input node is "Uy" if x is unequal to y.

25. The reference according to claim 21, wherein node state of said output node is "~Ux" when node state of said first input node is "Ux" and that of said second input node is "Uy" if x is equal to y.

26. The reference according to claim 21, wherein node state of said output node is "Uz" when node state of said first input node is "Ux" and that of said second input node is "~Uy" if x is unequal to y.

27. The reference according to claim 21, wherein node state of said output node is "0" when node state of said first input node is "Ux" and that of said second input node is "~Uy" if x is equal to y.

28. A simulating reference of a NOT (INV) gate, adapted to be used in logic simulation, obtained by defining a high potential state, a low potential state, an unknown state and a fourth state for an input node and an output node of said NOT (INV) gate.

29. The reference according to claim 28, wherein said simulating reference is a truth table.

30. The reference according to claim 29, wherein node number of said input node is 1 and node number of said output node is 2.

31. The reference according to claim 29, wherein said fourth state is an inverse unknown state.

32. The reference according to claim 31, wherein said high potential state is symbolized by "1", said low potential state is symbolized by "0", said unknown state is symbolized by "Un" and said inverse unknown state is symbolized by "~U", wherein "n" represents a node number of said node.

33. The reference according to claim 32, wherein node state of said output node is "~Ux" when node state of said input node is "Ux".

34. The reference according to claim 32, wherein node state of said output node is "Ux" when node state of said input node is "~Ux".

* * * * *